US012573464B2

(12) United States Patent
Razzaz et al.

(10) Patent No.: US 12,573,464 B2
(45) Date of Patent: Mar. 10, 2026

(54) MEMORY CONTROLLER USEABLE FOR A DYNAMIC RANDOM ACCESS MEMORY (DRAM) HEALTH MONITOR

(71) Applicant: NXP USA, Inc., Austin, TX (US)

(72) Inventors: Mazyar Razzaz, Austin, TX (US); Jan Spurek, Roznov pod Radhostem (CZ); Asim Abbas Zaidi, Austin, TX (US)

(73) Assignee: NXP USA, Inc., Austin, TX (US)

( * ) Notice: Subject to any disclaimer, the term of this patent is extended or adjusted under 35 U.S.C. 154(b) by 44 days.

(21) Appl. No.: 18/736,883

(22) Filed: Jun. 7, 2024

(65) Prior Publication Data

US 2025/0378898 A1    Dec. 11, 2025

(51) Int. Cl.
| *G11C 7/00* | (2006.01) |
| *G11C 29/12* | (2006.01) |
| *G11C 29/46* | (2006.01) |

(52) U.S. Cl.
CPC .... *G11C 29/12015* (2013.01); *G11C 29/1201* (2013.01); *G11C 29/46* (2013.01)

(58) Field of Classification Search
CPC .......... G11C 29/12015; G11C 29/1201; G11C 29/46
USPC ....................................................... 365/201
See application file for complete search history.

(56) References Cited

U.S. PATENT DOCUMENTS

| 6,909,980 B2 | 6/2005 | Fernando |
| 7,646,835 B1 | 1/2010 | Rozas |

| 8,379,467 | B2 * | 2/2013 | Deng .................... G11C 11/419 |
| | | | 365/201 |
| 8,607,104 | B2 * | 12/2013 | Cho ................... G11C 29/1201 |
| | | | 714/716 |
| 9,437,326 | B2 | 9/2016 | Razzaz et al. |
| 9,558,850 | B1 | 1/2017 | Bialas, Jr. et al. |
| 9,627,030 | B1 | 4/2017 | Bialas, Jr. et al. |
| 9,665,289 | B1 | 5/2017 | Mach et al. |
| 9,672,882 | B1 | 6/2017 | Jeter et al. |
| 9,715,907 | B1 | 7/2017 | Rao et al. |
| 9,971,975 | B2 | 5/2018 | Rao et al. |
| 10,446,222 | B2 * | 10/2019 | Schoenborn ........ G11C 11/4093 |
| 10,446,255 | B2 | 10/2019 | Chinnakkonda |
| | | | Vidyapoornachary |
| | | | et al. |
| 12,093,195 | B2 * | 9/2024 | Mozak ................ G06F 13/1694 |
| 12,367,943 | B2 * | 7/2025 | Kumar ................... G11C 29/16 |
| 2020/0202962 | A1 * | 6/2020 | Chen .................. G11C 16/0483 |
| 2021/0326041 | A1 | 10/2021 | Kumar et al. |

(Continued)

*Primary Examiner* — Viet Q Nguyen
(74) *Attorney, Agent, or Firm* — Joanna G. Geld

(57) ABSTRACT

A memory controller includes a first storage circuit which stores trained center eyes for a dual data rate (DDR) interface, each trained center eye including a corresponding trained delay value, and a second storage circuit which stores boundary points for the DDR interface. The memory controller includes test circuitry which halts normal operation and uses a corresponding trained delay value of a trained center eye for a first bit lane of the DDR interface as a starting delay value in performing a search for a first boundary point of a data eye margin by repeatedly adjusting a delay between a data signal (DQS) of the first bit lane and a corresponding data strobe signal (DQS) and performing a test with each adjusted delay. The test circuitry stores the first boundary point in the second storage circuit, restores the delay back to the corresponding trained delay value, and resumes normal operation.

20 Claims, 6 Drawing Sheets

(56)          References Cited

U.S. PATENT DOCUMENTS

| 2023/0100548 | A1* | 3/2023 | Ko ........................ H10B 43/10 |
| | | | 365/185.18 |
| 2024/0078029 | A1 | 3/2024 | Jeter et al. |
| 2024/0212729 | A1* | 6/2024 | Kim ..................... G11C 29/023 |
| 2025/0147906 | A1* | 5/2025 | Araiza ...................... G06F 1/10 |
| 2025/0298515 | A1* | 9/2025 | Liu ...................... G06F 3/0673 |

* cited by examiner

MEMORY CONTROLLER USEABLE FOR A DYNAMIC RANDOM ACCESS MEMORY (DRAM) HEALTH MONITOR

BACKGROUND

Field

This disclosure relates generally to DRAMs, and more specifically, to a memory controller useable for a DRAM health monitor.

Related Art

After a system or board with a DRAM is initialized and put in service, the DRAM interface is typically expected to operate without monitoring its health during its lifetime of operation. This may result in unexpected failures of the DRAM interface caused, for example, by system or circuit degradation (e.g. aging). The lack of monitoring may also, for example, result in missing identification of latent defects associated with manufacturing, an inability to assess memory margins (especially in those systems which do not implement comprehensive memory training), or the inability to warn against data eye degradation. Therefore, a need exists for improved health monitoring during a system's lifetime.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, a method of monitoring DRAM health during normal operation is provided, in which quick data eye margins can be generated and analyzed to determine the current DRAM health. For example, after initial training performed upon system reset, trained center eye pixels for each data signal (DQ) of the DRAM interface can be determined and stored, which corresponds to a set of trained values (such as the delay between the DQ and corresponding strobe signal (DQS), and reference voltage) which provides the greatest margin. Then, during normal operation, normal operation can be temporarily halted for boundary point (BP)

determination time slices in which one or more BPs for each DQ can be determined and logged. In one embodiment, each BP can be determined by sweeping values of the delay or reference voltage, or both, to determine the passing boundary point value. For example, each BP may be determined using a binary search starting from the corresponding trained center eye. At the conclusion of each BP-determination time slice, the delay and reference voltage values are restored to the trained center eye values. This allows for the resumption of normal operation without requiring a system restart or reset. Once a sufficient number of BPs has been determined and logged, a quick data eye margin can be derived, which can be used to determine the current DRAM health. This quick data eye margin can therefore be generated, as needed, during normal operation to monitor the DRAM health.

Figure 1:
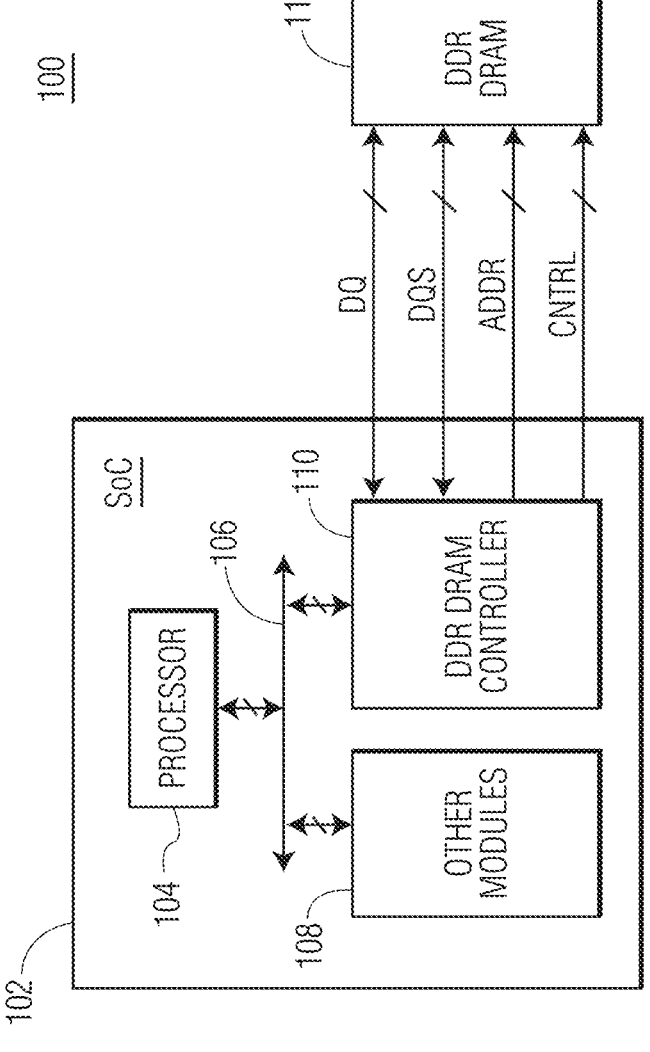
FIG. 1 illustrates, in block diagram form, a system having a system on chip (SoC) coupled to a DRAM, the SoC including a DRAM controller with a DRAM interface, in accordance with one embodiment of the present invention.

FIG. 1 illustrates, in block diagram form, a system 100 having a system on chip (SoC) 102 coupled to a DRAM 112, in accordance with one embodiment of the present invention. DRAM 112 is implemented as a double data rate (DDR) DRAM (and may also be referred to as a DDR memory). SoC 102 includes a processor 104, a DDR DRAM controller 110 (which may also be referred to as a memory controller), and may also include any number of other modules 108. SoC 102 can be any type of SoC, in which, for example, processor 104 can be any type of processor. Other modules 108 may include, for example, additional processors, memories, or any other types of modules, as needed. DRAM controller 110 includes a DRAM interface which communicates data signals (DQ), data strobe signals (DQS), address signals (ADDR), and control signals (CNTRL) with DRAM 112. Note that alternate embodiments may include additional signals communicated between DRAM controller 110 and DRAM 112. The combination of memory controller 110 and DDR memory 112 may be referred to as a DDR memory system.

A DDR DRAM uses a clocking technique whereby two data bits are transferred per clock cycle or DQS cycle, or once every clock edge or DQS edge, to significantly improve speed. In a typical non-DDR memory system, both the memory controller and memory transmit or capture data in response to a single system clock. Compared to single data rate ("SDR") DRAM, a DDR DRAM interface makes higher transfer rates possible by more strict control of the timing of the electrical data and clock signals. However, implementations often have to use schemes such as phase-locked loops and self-calibration to reach the required timing accuracy. The interface uses double pumping (transferring data on both the rising and falling edges of the clock signal) to lower the clock frequency. The name "double data rate" refers to the fact that a DDR DRAM with a certain clock frequency achieves nearly twice the bandwidth of a SDR DRAM running at the same clock frequency, due to this double pumping.

While DDR implementations can achieve a 2× effective increase in the bit rate of a system, this effectively cuts the valid data window (also referred to herein as a "data eye") in half. The result is that a more substantial piece of the timing budget for a memory cycle is now being taken up by the physical board routing delays and variations due to the temperature and voltage under which a particular system is implemented and operated.

Whereas with SDR memories, the data eye was relatively large, with the faster transfer frequencies associated with DDR memories, the data eye is much smaller, and increasingly shrinking. DDR memory interfaces rely on the use of the bi-directional data strobe signal (DQS). A DQS signal transition is used to time the sending or capture of a data signal (DQ). A DQS signal is often generated from a differential system clock fed to the DDR memory, and a delay-locked loop ("DLL") inside the DDR memory can be used to generate and properly align the DQS signal. For example, when a read operation is performed, DDR memory 112 outputs both data (i.e. read data) and a DQS signal transition edge-aligned with each other. In order to capture the data at input registers of memory controller 110 with proper setup and hold times, the DQS signal from the memory needs to be phase shifted 90 degrees. This has the effect of "centering" the DQS signal transition edge with the center of the valid data window, providing maximum setup and hold time for capturing the incoming data. Thus, it is important to properly place the DQS signal transition in the valid data window (i.e. in the data eye). When a write operation is performed, memory controller 110 provides both data (i.e. write data) and a DQS signal to DDR memory 112, ensuring that the write data is centered within DQS signal transition edges for use by DDR memory 112.

Therefore, the DDR architecture essentially transfers two data words per clock or DQS cycle at the DRAM interface of SoC 102, in which the DQS signal is transmitted externally, along with data (on the DQ lines), for use in data capture at DRAM 112 in the case of write operations and at DRAM controller 110 in the case of read operations. That is, the DQS signal is transmitted by the DRAM 112 during reads and by the DRAM controller 110 during writes. The signal transitions of the DQS signal are edge-aligned with the DQ data eye for reads and center-aligned with the DQ data eye for writes. The DDR interface may operate with respect to differential clock signal (CLK/CLKN, not shown), as known in the art, which can increase accuracy caused by clock jitter by using the crossing points of the differential clock signals.

Note that a DQS signal is typically generated for eight lanes of data (DQ) to or from DRAM 112, however, different embodiments may use any number of lanes of data per DQS signal. As used herein, each lane of data may be referred to as a bit lane, in which eight lanes of data may be referred to herein as a byte lane. The DDR interface corresponds to the signal interface at SoC 102 used to communicate with DRAM 112 (e.g. the ports or I/O pins used to communication DQ, DQS, ADDR, and CNTRL, as well as any other signals not illustrated in FIG. 1). The DRAM interface of SoC 102 may be considered to be a part of DRAM controller 110 of SoC 102. In one embodiment, the DRAM interface communicates 32-bit DQ values between SoC 102 and DRAM 112 (which corresponds to the width of the data bus between SoC 102 and DRAM 112) and communicates 4 single-bit DQS signals between SoC 102 and DRAM 112, each single-bit DQS signal corresponding to a byte lane of DQ. Alternate embodiments may use different bus widths to communicate the data signals, may use a different number of DQS signals, and may use any bus width, as needed, to communicate the address signals and CTRL signals, based on the implementation of system 100.

Since the timing of the DQS signal transitions is important for properly performing reads and writes, training and calibration is typically performed during a power-on initialization and training sequence in which, during such a training sequence, circuitry within DRAM controller 110 is calibrated to center the DQS signal transition in the data eye. Note that operation of a DDR DRAM system with respect to normal reads and writes using the DQS signal, as well as training and calibration of the DRAM interface at the DRAM controller, are known in the art and will not be described in more detail herein, except to the extent required for understanding the run-time DRAM health monitoring to be described below.

Figure 2:
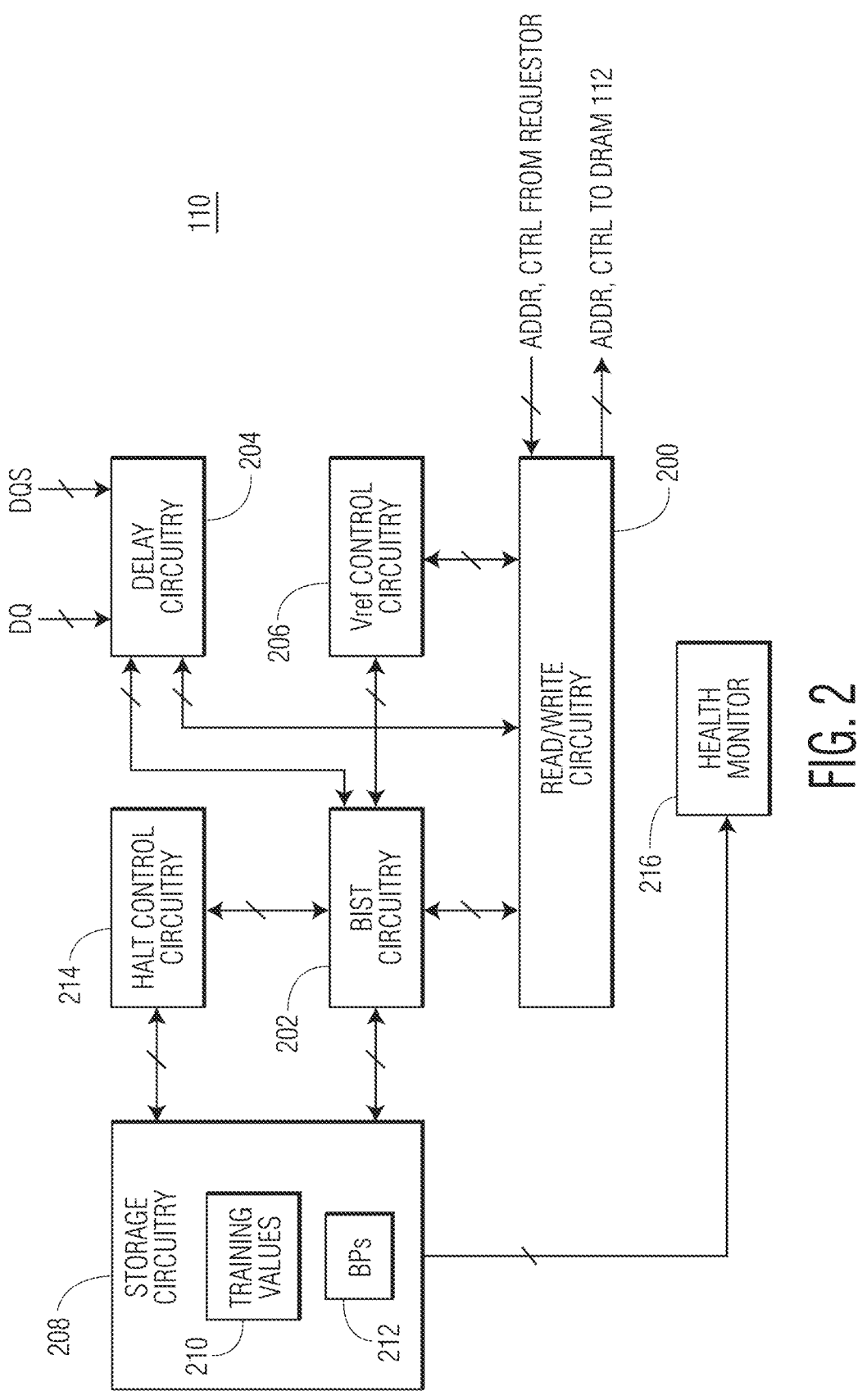
FIG. 2 illustrates, in block diagram form, a more detailed view of the DRAM controller of FIG. 1, in accordance with one embodiment of the present invention.

FIG. 2 illustrates, in block diagram form, a more detailed view of controller 110, in accordance with one embodiment of the present invention, which is used to perform run-time DRAM health monitoring which is non-destructive for the data contained in DDR memory 112. Controller 110 includes storage circuitry 208 having a storage circuit 210 configured to store training values and a storage circuit 212 configured to store BPs. Storage circuitry 208 can be implemented with any type of circuitry, and may be configured to store other types of information for use by controller 110. Alternatively, each of storage circuits 210 and 212 may be located elsewhere within SoC 102, outside of controller 110. Controller 110 includes read/write circuitry 200, built-in self test (BIST) circuitry 202, halt control circuitry 214, delay circuitry 204, Vref control circuitry 206, and health monitor circuitry 216 (also referred to as health monitor 216). Read/write circuitry 200 is configured to receive address (ADDR) and control information (CTRL) corresponding to read and write access requests received from a requestor of SoC 102 (e.g. processor 104) to DRAM 112, as known in the art, includes known circuitry to perform the reads from and writes to DRAM 112 (which may include column and row decoders, sense amplifiers, etc.), and provides ADDR and CTRL to DRAM 112 for the read and write operations in DRAM 112, as known in the art. Read/write circuitry 200 is bidirectionally coupled to BIST circuitry 202, delay circuitry 204, and Vref control circuitry 206. Delay circuitry 204 is configured to receive each of DQ and DQS and is capable of shifting either signal, or both, as needed, and Vref control circuitry 206 is configured to generate the voltage supply Vref at the desired voltage, as needed. BIST circuitry 202 is bidirectionally coupled to storage circuitry 208, halt control circuitry 214, delay circuitry 204, and Vref control circuitry 206, and can access the circuitry within controller 110 as needed to perform built-in self tests, such as to determine the BPs and store them into storage circuitry 212. Health monitor circuitry 216 is capable of analyzing the stored BPs to generate quick data eye margins to provide an indication of the current health of DRAM 112. Halt control circuitry 214 is also bidirectionally coupled to storage circuitry 208. Operation of controller 110 will be described in further detail in reference to FIGS. 3-6 below. Note that each block will be described to the extent needed to explain the embodiments herein, but may include additional circuitry and functionality not described herein. Note also that controller 110 may include additional circuitry, as needed, to perform all its functions, in which the additional circuitry can be included and implemented as known in the art.

Figure 3:
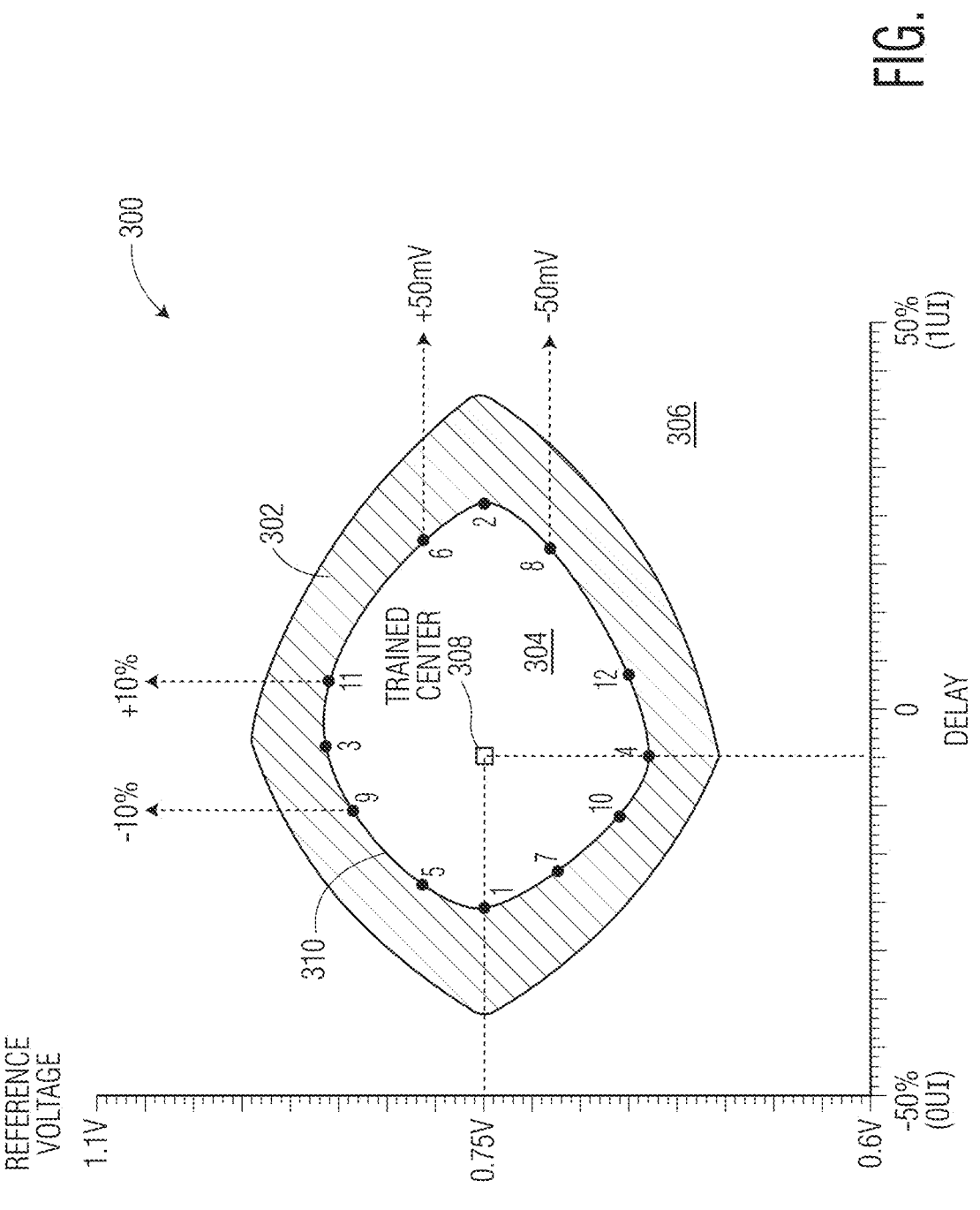
FIG. 3 illustrates an example of a data eye margin for the DRAM interface of FIG. 1.

FIG. 3 illustrates, in diagrammatic form, a data eye margin 300 corresponding to a bit lane of the DRAM interface of FIG. 1, and having a corresponding center eye pixel 308, in accordance to an embodiment of the present invention. Data eye margin 300 may correspond to any of the 32 bits lanes of DQ (in which each bit lane of DQ would have its own corresponding data eye margin). The X-axis corresponds to a range of delays within 1 unit interval (UI) of time, from 0 UI to 1 UI, incrementing in N equal delay steps (e.g. 64 delay steps). For example, 1 UI may correspond to one clock cycle, in which the delay may refer to the delay between DQ and the corresponding DQS. In this example, the center point of the X-axis corresponds to the trained delay in which the DQ eye 308 is center-aligned to the DQS transition (the DQS edge). The points further to the left correspond to negative delays in which one of signals (e.g. the DQ transition) lags the DQS transition by a portion of the clock cycle while points further to the right correspond to positive delays in which the one of the signals leads the DQS transition. Therefore, the point furthest to the left at 0 UI (corresponding to a delay of −50% UI) or furthest to the right at 1 UI (corresponding to a delay of 50% UI) indicates a maximum delay (i.e., positive or negative delay) between DQ and DQS of half a clock cycle. The Y-axis represents a range of reference voltages (Vref) from 0.6V to 1.1V, incrementing in M equal voltage steps (e.g. 64 voltage steps). The Vref voltage may correspond to the voltage level (or a percentage of the voltage level) powering the DRAM interface. The trained Vref voltage is the voltage corresponding to the trained center, obtained during the training of the DRAM interface. By changing the Vref value, the sampling point shifts vertically (along the Y-axis). This is similar to shifting delays to shift the sampling point horizontally (along the X-axis). Note that in alternate embodiments, N and M can have different values other than 64, and Vref may range between different voltage limits than 0.6V to 1.1V. The intersection of each delay step and voltage step corresponds to a pixel of data margin 300, in which each pixel represents a particular delay value and voltage value.

Referring to FIG. 3, data eye margin includes a data eye portion 304 (referred to as data eye 304) and a margin portion 302 (also referred to as a marginal portion 302 or simply as margin 302 or marginal 302). The pixels within data eye 304 correspond to "passing" pixels, in which the corresponding combination of delay/voltage values for a passing pixel meets the required setup, hold, and voltage requirements for a valid memory operation and thus corresponds to the valid data window. The pixels outside data eye margin 300 (corresponding to portion 306 surrounding margin 302) correspond to "failing" pixels, in which the corresponding combination of delay/voltage values fails the requirements for a valid memory operation. The pixels within margin 302 include a combination of passing and failing pixels, therefore, the combination of delay/voltage values within margin 302 cannot be reliability counted on for a valid memory operation, only those within data eye 304 are reliable. A boundary 310 separates the passing pixels of data eye 304 from margin 302, such that no pixel within boundary 310 corresponds to a failing pixel.

Training is performed to obtain the trained center eye pixel for each DQ bit lane of the DRAM interface (in which a trained center eye pixel may also simply be referred to as a trained center eye). A training sequence can therefore be performed for each corresponding DQ in which this training sequence may be run by a state machine (not shown) within DDR controller 110. The purpose of such a training sequence is to train the DDR memory system to center the DQS signal transition within DQ data eye to determine an optimal placement of the DQS signal transition within the data eye. For the corresponding DQ of the example of FIG. 3, the optimal placement corresponds to center eye pixel 308 which is located in the center of data eye 304, thus the desired result from the training is to obtain the corresponding delay/voltage values corresponding to center eye pixel 308 (which can therefore be referred to as trained center eye 308 or trained center 308). Ideally, using the corresponding delay/voltage values of trained center eye pixel 308, the greatest margin is achieved (since center eye pixel 308 is furthest from boundary 310 in any direction). That is, the delay or voltage can vary a largest amount from center eye pixel 308 than from any other passing pixel within eye 304 and still provide for a valid memory operation. Any DDR interface requires training, in which this training may include different types of training, in which one of the training sequences is the data eye training. Therefore, any known DDR training methods may be used to obtain the center eye pixels for the DQ bit lines (or for a DQ byte lane), in which each of the trained eye pixels (e.g. the delay/voltage values for each of the trained eyes) for the DDR interface can be stored within storage circuit 210. (Note that the trained center eye pixels may be an approximate centers since the limitations of delay and voltage circuitry may not permit the delay/voltage values of the exact center to be selected. Also, additional values or conditions, in addition to delay and voltage values, may be set by the trained center eye pixels.)

The DDR training to obtain the trained center eye pixels (such as trained center eye 308) is typically performed after a reset and before normal operation begins. Note that the DDR training to obtain the center eye pixels does not require generating the full data eye margins. Referring to the example of FIG. 3, data eye margin 300 corresponds to a full data eye margin, which can be generated, for example, for diagnostic purposes to better understand the margins of the data eye under various conditions. Such diagnostic data eye margins can be performed after the training is completed to evaluate how good the training was in obtaining the center eye pixel. However, the detailed nature of these diagnostic data eye margins takes too long to complete, making them destructive if generated during normal operation. For example, a full data eye margin generation sequence to obtain data eye margin 300 for the corresponding DQ may include traversing the delays, in the unit interval from 0 UI to 1 UI with 64 delay steps, at a particular Vref value. At each of the 64 delay steps, a write-read-compare (WRC) test is performed to determine pass or fail for each step. For example, a WRC test may include a set of write, read, and compare operations, in which, for each write, read, and compare operation, DRAM controller 110 performs a write operation of a 32-bit write value to a particular address and then a read operation from the particular address to obtain a 32-bit read value, followed by a comparison between the write and read values. The write, read, and compare operations are repeated as needed to complete the full set of write, read, and compare operations for a WRC test, in which the set may include any number or repetitions based on the data patterns of the write values and addresses. If all the comparisons match during the WRC test, the corresponding pixel is labeled a passing pixel, otherwise, it is labeled a failing pixel. In one example, each WRC test includes 255 write, read, and compare operations which are performed for a selected pixel. Note that any known testing, including any type of WRC test, can be applied to each pixel to determine whether a pixel is passing or failing.

The traversal of the 64 delay steps is repeated for each of the 64 voltage values of Vref. Therefore, the traversal of delay steps at a particular Vref value generates a line of pixels of data eye margin 300, and by repeating the traversal of delay steps for each value of Vref, all the lines of pixels of data margin 300 are generated. Data eye margin 300 is therefore generated by performing N×M (64×64=4096) WRC tests to obtain all the passing and failing pixels of data eye margin 300. In the case that each WRC test includes 255 operations, generating the pixels of data eye margin 300 requires "255×4096" write, read, and compare operations. After generating data eye margin 300, the center eye can be identified. The identified center eye can then be compared to the trained center eye to evaluate the training.

Full data eye margins could also be studied, over time, to determine system degradation. However, generating the full data eye margins can take up to several minutes to complete. For example, if there are 32 DQ bit lanes, then "255×4096× 32" write, read, and compare operations are required. This makes the traditional full data eye margin acquisition procedures prohibitive during normal operation and thus cannot be used to provide health information during normal operation. However, various factors (such as those due to aging of system 100) may affect the data margins and it is helpful to understand how the margins are being affected over time. A DRAM health monitor, as will be described below, may analyze information obtained by test circuitry (such as built-in self-test circuitry (BIST)) on how the data eye margins are being affected over the life of the product during normal operation, by generating quick data eye margins using the previously determined trained centers, without requiring the generation of any full data eye margins.

As discussed above, training to obtain the trained eye centers can be done upon reset, prior to normal operation, and stored within training values storage circuit 210. In this manner, during normal operation, for each DQ, the transition of the corresponding DQS corresponds with the trained center eye. For example, referring to trained center eye 308 for the corresponding DQ, the corresponding reference voltage is set to 0.75V and the delay is set to "−($\frac{1}{16}$)*clock period." As described above, the delay refers to the relative delay between DQ and the corresponding transition of the corresponding DQS for performing a memory operation. In the case of a read operation, the DQ signals and the corresponding DQS signals are received by DRAM controller 110, and DRAM controller 110 may include delay circuitry capable of delaying any or all of the received DQ and DQS signals. For example, delay circuitry 204 may include several different delay chains for each DQ signal and may also include several different delay chains for each DQS signal, as known in the art. Delay circuitry 204 may therefore apply delays, as needed, to either DQ or DQS, or both, to result in the desired delay corresponding to the trained center eyes for each DQ. Therefore, during normal operation, the delay for each DQ as well as DQS can be set as indicated by the corresponding trained center eye for the DQ.

Since the delay for each DQ is set in accordance with the corresponding trained center eye, then ideally, a greatest level of margin can be achieved for each DQ. That is, the margin refers to how much the relative delay between DQ and DQS can change and yet still meet the timing requirements for a valid operation. However, over time, due to various factors, such as aging of the DRAM, the margin for each DQ may shrink. For example, referring to data eye margin 300 of FIG. 3, over time, if a complete data eye margin were again created (with a full sequence as was described above), it is likely that data eye 304 would be smaller, providing less margin for the delay between DQ and DQS. This change in margin reflects a change in the DRAM health, in which a reduction in margin can indicate a drop in DRAM health. However, as described above, to apply a full sequence takes far too much time and requires a system reset in order to enter normal operation. Therefore, the full sequence cannot be used during operation (such as during operation in the field) to monitor DRAM health.

Figure 4:
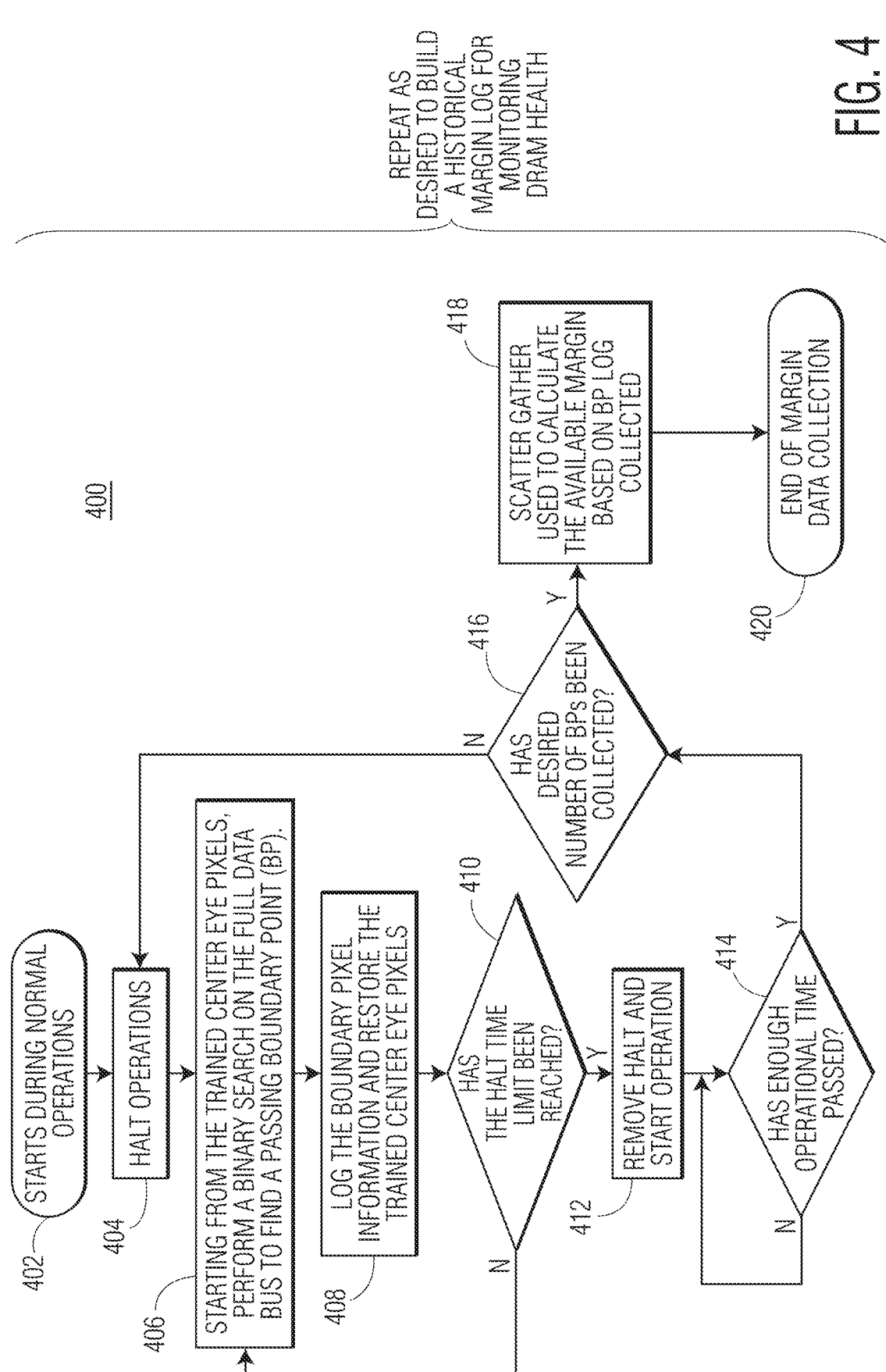
FIG. 4 illustrates a flow chart of a method of operation for the DRAM controller of FIG. 1, in accordance with one embodiment of the present invention.
Figure 5:
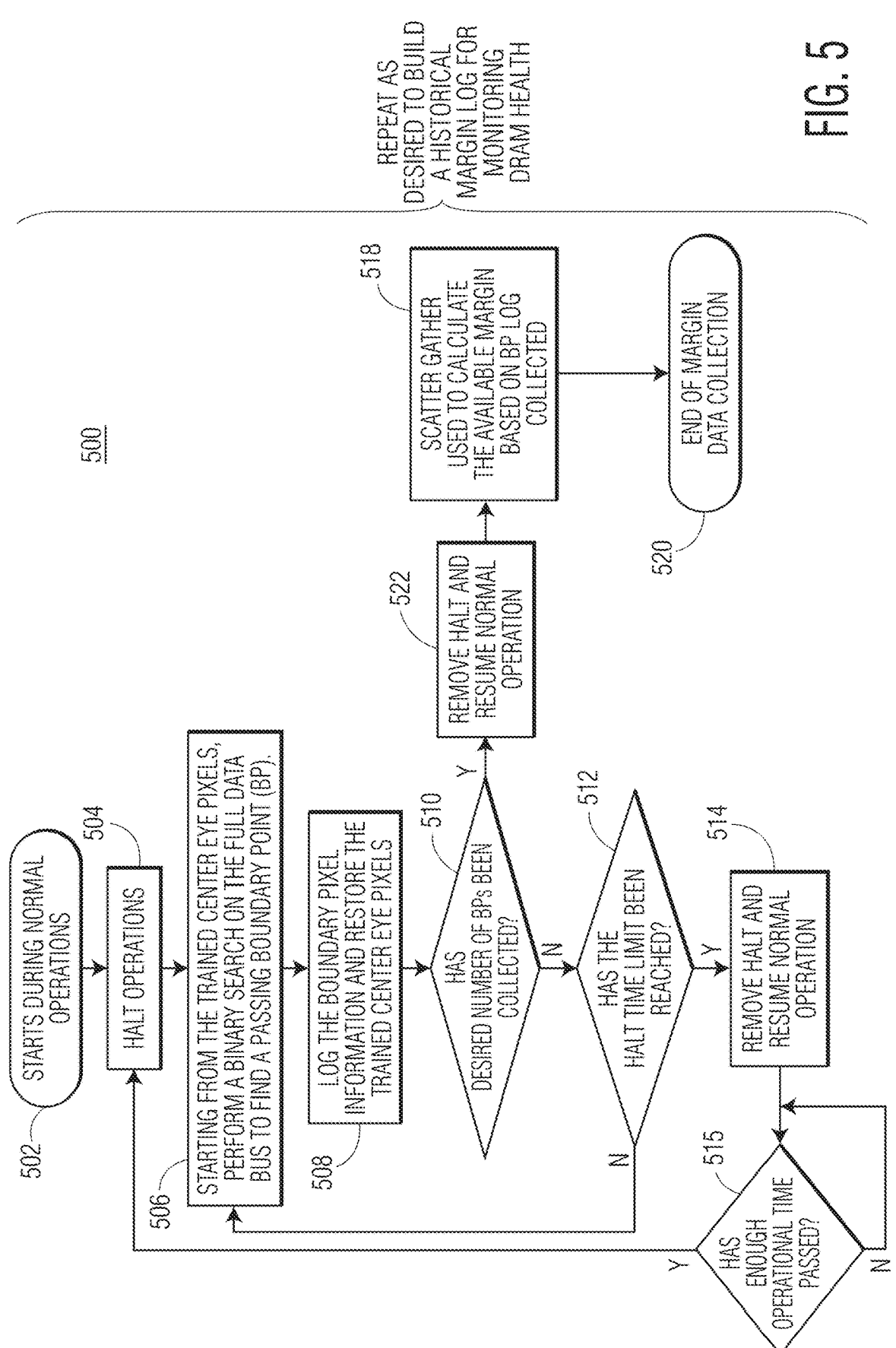
FIG. 5 illustrates a flow chart of a method of operation for the DRAM controller of FIG. 1, in accordance with one embodiment of the present invention.
Figure 6:
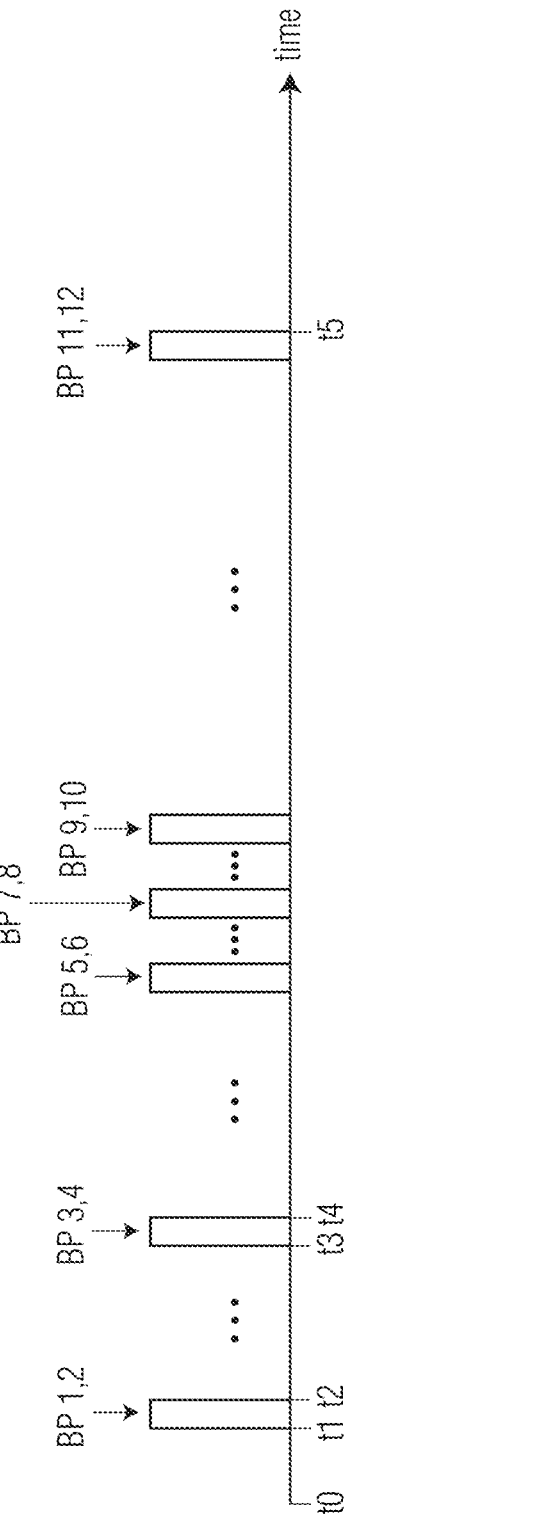
FIG. 6 illustrates a timing diagram of a scatter-gather method used by the method of FIG. 4 or FIG. 5, in accordance with one embodiment of the present invention.

FIGS. 4 and 5 illustrate methods for checking DRAM health by using the trained eye centers as a starting point to determine a set of boundary points (BPs) which can be used to monitor DRAM health, and both will be described in reference to FIG. 6 which illustrates a timeline for obtaining the BPs, in accordance with various embodiments of the present invention. The BPs can be determined over time using a scatter gather method, in which between determination of a particular number of BPs, normal operation can resume without requiring a system reset (e.g. without requiring a reset of SoC 102). Once a minimum number of BPs is obtained, a rough data eye margin can be generated and analyzed to determine current DRAM health, in which the BPs can be obtained in a non-destructive fashion (i.e. without requiring system resets). For each of FIGS. 4 and 5, it is assumed that a training sequence has previously been performed, such as during power-up, in which the trained eye center pixels (i.e. the trained eye centers) have been stored into DDR controller 110. Storing the trained eye center pixels may include storing the corresponding Vref and delay values (and possibly other condition values) for each trained eye center pixel.

FIG. 4 illustrates a method 400 for monitoring DRAM health which starts in block 402 with normal operation. That is, SoC 100 with DRAM controller 110, as well as DRAM 112, are in normal operation. This may correspond, for example, to time t0 in FIG. 6. During normal operation, the trained center eye values are used to set the proper delays between the DQs and corresponding DQSs of the DDR interface and the proper value for Vref. In the illustrated embodiment, it is assumed that the DQs are delayed in accordance with the center eye values to achieve the proper delays between the DQs and corresponding DQSs. At block 404, DRAM controller 110 is halted, i.e. paused, so that operations on DRAM 112 are halted. For example, this may correspond to time t1 of FIG. 6, and may be performed by halt control circuitry 214. In one embodiment, operations are halted for a fixed amount of time each time, in which this fixed amount of time may correspond to the amount of time between t1 and t2 of FIG. 6. Therefore, note that halt control circuitry 214 may also include timers or counters, as needed, to keep track of the halt times. With operations halted, method 402 proceeds to block 406 in which, starting from the trained center eye pixels for each DQ (obtained from storage circuit 210), a binary search is performed using the full data bus (e.g. the full bus for communicating DQ between DRAM controller 110 and DRAM 112) to find a passing BP. This binary search can be performed under the control of BIST circuitry 202, using read/write circuitry 200, delay circuitry 204, and Vref control circuitry 206, as needed. For example, BIST circuitry 202 is capable of controlling delay circuitry 204 to vary (e.g. delaying) either of DQ or DQS and Vref control circuitry 206 to vary Vref. Note that BIST circuitry 202 may include timers, counters, state machines, control circuitry, etc., as needed to perform the operations described herein to perform the searches to obtain the BPs and to perform any other desired testing functions, as needed.

For example, starting from the trained center eye for each DQ (such as trained center eye 308 for the corresponding DQ, obtained from storage circuit 210), the first BP searched for in block 406 corresponds to BP1, in which Vref is set to 0.75V, and a binary search (as known in the art) is performed to find the location of BP1 along a boundary between the pixel passing or failing. For example, with respect to the corresponding DQ of FIG. 3, for the binary search, the half way point between the furthest left point (corresponding to 0 UI, or a "−50% UI" delay in the illustrated example) and trained center 308 is selected as a first test pixel for performing a WRC test (in which, as described above, each WRC test may include any number of write, read, and compare operations). In one embodiment, the entire interface (all DQs) are simultaneously delayed (shifted) and examined to learn about the degradation of the data eye margin. In this embodiment, the WRC test is performed on the full data bus because it does not matter if only one bit fails or more bits fail, because if any bit fails then the WRC test is deemed a fail. For example, if 0xFFFF FFFF is written but 0xFFFF FFEF is read back, then the comparison fails. However, in an alternate embodiment, one bit lane can be shifted and examined at a time to learn about the degradation of the data eye margin corresponding to that particular bit, and in another embodiment, one byte lane can be shifted and examined at a time to learn about the degradation of the data eye margin corresponding to that particular byte lane.

If the WRC test passes, it is known that the boundary point is further to the left of the selected point and if it fails, it is known that the boundary point is further to the right of the selected point. A new selected point is then selected halfway between the previous selected point and either the trained center or the further left point, depending on whether the previous point passed or failed. This continues until zeroing in on the value of BP1 along Vref=0.75V. Therefore, for each search, using the trained center eye values as the starting point, the delay (or Vref) values are adjusted and tested until the corresponding BP is found. After determining the current BP (BP1), the delay and voltage values for BP1 (the boundary pixel) for each DQ are logged (i.e. stored in storage circuit 212), and the delay and Vref values of the trained center eyes (such as trained center eye 308) are restored (e.g. from storage circuit 210) in block 408. Next, at decision diamond 410, it is determined if the halt time limit has been reached (e.g. if the fixed amount of halt time has expired, corresponding to time t2). If not, then method 400 returns to block 406 in which a binary search is performed for a next BP, which may refer, for example, to BP2 of FIG. 3. Upon determination and subsequent logging of BP3, it is again determined if the time limit has been reached. If so, method 400 proceeds to block 412 in which the halt is removed so that normal operation can resume. Note that, since the trained center eyes were restored in block 408, prior to removal of the halt, the determination of the BPs was non-destructive and normal operation can resume without requiring a system reset (e.g. without resetting the SoC).

Once back in normal operation, system 100 remains in normal operation, at decision diamond 414, until it is determined that enough operation time has passed. That is, depending on the system, the minimum operational time (i.e. the minimum time in normal operation) can be set to a particular value (such as by programming the counters or timers in halt control circuitry 214 or within BIST circuitry 202). Once enough operational time has passed, at decision diamond 416, it is determined whether enough BPs have been collected to perform a margin analysis (to form a rough estimation of the current data eye margin) by, e.g., health monitor 216. In one embodiment, 12 BPs are collected before performing the analysis. Alternatively, a different number of BPs may be deemed sufficient. If the desired number of BPs has not yet been collected, method 400 returns to block 404 in which normal operation is again halted. If the desired number of BPs has been collected, method 400 continues to block 418 in which scatter gather is used to calculate the available margin based on the collected BP log (by, e.g., using the collected BPs to generate a quick data eye margin). Therefore, block 420 represents the end of margin data collection which can be analyzed by health monitor 216 to determine DRAM health. For example, health monitor 216 can compare the quick data eye margin to a previously generated quick data eye margin to observe changes over time. Method 400 can be repeated as desired to build a historical margin log for continuously monitoring DRAM health. Note that although health monitor 216 can be implemented as circuitry within controller 110, as illustrated in FIG. 2, health monitor 216 can be located elsewhere within SoC 102. Also, health monitor 216 can instead be implemented in software such that the DRAM health monitoring using the collected margin data can be performed by software executing on SoC 102.

Referring back to decision diamond 416, in which a desired number of BPs has not yet been collected, method 400 returns to block 404 so that additional BPs can be determined. In one embodiment, the predetermined halt times during operation allows for two BPs to be determined before returning to normal operation. For example, as seen in FIG. 6, each rectangle represents a fixed halt time during which a pair of BPs is determined by starting from the trained center eyes, performing a binary search on the full data bus, and then restoring the trained center eyes. Therefore, during a first iteration through blocks 404 to 412, BP1 and BP2 are determined and logged. During the next iteration, BP3 and BP4 are determined and logged. Therefore, as seen in FIG. 6, after 6 halt periods, all 12 BPs have been collected. Each of the halt periods of FIG. 6 may be referred to as a "BP-determination" time or slice, in which, in the illustrated embodiment of FIG. 6, 6 slices are needed to obtain 12 BPs.

The determination of each BP can be performed by using a binary search method as was described above with respect to BP1 and BP2, in which the delay/voltage values are altered, as needed, to determine the corresponding BP. For example, for BP3 and BP4, the delay value may remain fixed as the same as trained center 308 while the voltage values are changed to search for the BPs. For BP 3 of the example of FIG. 3, the binary search is performed by varying Vref between trained center 308 and a topmost value of Vref, while for BP4, the binary search is performed by varying Vref between trained center 308 and the bottom most value of Vref, while delay remains fixed. Regardless, after the determination of each BP, the delay/voltage values are restored to the trained eye centers to allow for resumption of normal operation.

Any order and any method may be used to select which BPs to determine. For example, referring to FIG. 3, after BP1-BP4, BP5 can be determined by fixing Vref to the trained center plus a Vref offset (e.g. Vref+50 mV) and performing the binary search by varying the delay between the left most value of delay and the delay of trained center 308. Similarly, BP6 can be determined by then varying the delay between the trained center and the right most delay. BP7 and BP8 can be determined analogously to BP5 and BP6, but by fixing Vref to the trained center minus the Vref offset (e.g. Vref–50 mV). After BP5-BP8, BP9 can be determined by fixing the delay to the trained center minus a percentage offset (e.g. delay–10% UI) and performing the binary search by varying voltage between the topmost value and the voltage of trained center 308. Similarly, BP10 can be determined by then varying the voltage between the trained center and the bottom most voltage. BP11 and BP12 can be determined analogously to BP8 and BP9, but by fixing the delay to the trained center plus the percentage offset (e.g. delay+10% UI). In this manner, at time t5 of FIG. 6 (i.e. upon reaching block 418 of FIG. 4), 12 BPs have been determined and logged, in which these 12 BPs provide a quick eye margin (an estimate of the current eye margin) for DRAM 112. The BPs are therefore used to provide "quick" eye margins in that the quick eye margins are generated using only a selected subset of pixels (e.g. 12 pixels or 12

BPs) without the need to generate full data eye margins. This information can then be analyzed by health monitor 216 to determine the DRAM health. For example, over time, the quick eye margins may indicate an increase in margin degradation, indicating that memory failure may be approaching faster.

Note that in alternate embodiments, any number of BPs can be collected on which to apply the scatter gather method to obtain the quick eye margin. Also, in alternate embodiments, other search methods other than the binary search method may be used to find each BP. Also note that the BPs can be determined based on any parameter of the DDR interface (e.g. delay, reference voltage, or other parameter) in which any parameter can be repeatedly adjusted during the searches to determine the corresponding BP. However, regardless of which BPs are determined or which search method is used to determine the BPs, during determination of the BPs, the delay/voltage values (or other parameter value) are always restored back to the trained center eyes so that normal operation can be resumed without requiring a system reset. In this manner, the scatter gather method for each system can be designed, as needed, to determine how long each BP-determination slice should be (e.g. how long each slice is in FIG. 6), how many BPs can be determined in each slice (which can be more or fewer than the two BPs per slice of the example of FIG. 6), and for how long normal operation is resumed before interrupting with another BP-determination slice. In one embodiment, implementation of the scatter gather method (including control of the BP-determination slices) can be performed by BIST circuitry 202 in combination with halt control circuitry 214.

FIG. 5 illustrates a method 500 for monitoring DRAM health which starts in block 502 with normal operation. Blocks 502, 504, 506, and 508 are analogous to blocks 402, 404, 406, and 508 of FIG. 4, therefore, the same descriptions provided above with respect to FIGS. 4 and 6 for these blocks apply to FIGS. 5 and 6 as well. After block 508, at decision diamond 510 (analogous to decision diamond 416), it is determined if the desired number of BPs has been collected. If not, method 500 proceeds to decision diamond 512 in which it is determined whether the halt time limit has been reached. The description provided above with respect to decision diamond 410 and the halt time limit (e.g. the duration of each BP-determination slice) described above with respect to FIG. 4 also apply here. If the time limit has not been reached, method 500 returns to block 506 to determine a next BP, in which, just as in FIG. 4, any order and any number of BPs can be determined during each BP-determination slice.

If the halt time limit has been reached at decision diamond 512, then method 500 proceeds to block 514 and to decision diamond 515, which operate analogously to block 412 and decision diamond 414 of FIG. 4, except that once enough operational time has passed, method 500 returns to block 504 to halt operation and continue with a next BP-determination slice. That is, in FIG. 5, unlike FIG. 4, before returning to block 504, there is no need to determine if the desired number of BPs has been collected because that was determined earlier in the method at decision diamond 510. Referring back to decision diamond 510, if the desired number of BPs has been collected, method 500 proceeds to block 522 in which the halt is removed and normal operation is removed (again, without requiring a system reset because the trained center eye pixels were previously restored at block 508). At some point after resuming normal operation, at block 518, scatter gather is used to calculate the available margin based on the BP log collected (in which the scatter gather is used to obtain and log sufficient BPs for margin analysis by, e.g., generating a quick data eye margin). Block 520 indicates the end of margin data collection. Note that blocks 518 and 520 are analogous to blocks 418 and 420 described above in reference to FIG. 4. As with method 400, method 500 can be repeated as desired to build a historical margin log for monitoring DRAM health.

Note that the testing operations of method 400 and method 500, including performing searches to determine and log sufficient BPs, can be performed under the control of BIST circuitry 202 or under the control of BIST circuitry 202 in combination with halt control circuitry 214, in which the circuitry which controls the testing operations of method 400 or 500 may be referred to collectively as test circuitry. Note also that while methods 400 and 500 illustrate various embodiments on how to determine various BPs during BP-determination slices while operating in normal operation, alternate embodiments may perform some of the steps in different orders than those illustrated in FIGS. 4 and 5.

By now it should be appreciated that there has been provided a method for monitoring DRAM health by producing quick margin checks during normal operation. In doing so, normal operation can be halted to allow for BP-determination time slices, in which, at the conclusion of each time slice, normal operation can be resumed. At the end of each BP-determination time slice, during which one or more BPs can be determined by using search methods which perform sweeps beginning with the values set by the trained center eye pixels, all the trained center eye pixels of the DQs are restored. This ensures that the BP-determination times or slices are non-destructive, thus allowing normal operation to resume without requiring a system restart or reset. The determined BPs can be used to develop a quick data eye margin at any point during operation in order to monitor DRAM health.

As used herein, the term "bus" is used to refer to a plurality of signals or conductors which may be used to transfer one or more various types of information, such as data, addresses, control, or status. The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or an asterisk (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Brackets are used herein to indicate the conductors of a bus or the bit locations of a value. For example, "bus 60 [7:0]" or "conductors [7:0] of bus 60" indicates the eight lower order conductors of bus 60, and "address bits [7:0]" or "ADDRESS [7:0]" indicates the eight lower order bits of an address value. The symbol "$" or "0x" preceding a number indicates that the number is represented in its hexadecimal or base sixteen form. The symbol "%" or "0b" preceding a number indicates that the number is represented in its binary or base two form.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Some of the above embodiments, as applicable, may be implemented using a variety of different information processing systems. For example, although FIG. 1 and the discussion thereof describe an exemplary information processing architecture, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Also for example, in one embodiment, the illustrated elements of SoC 100 are circuitry located on a single integrated circuit or within a same device, with DRAM memory 112 external to SoC 100. Alternatively, DRAM memory 112 may also be located on the same integrated circuit.

Furthermore, those skilled in the art will recognize that boundaries between the functionality of the above-described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, although the DDR controller, memory, and interface described herein corresponds to a DRAM, other types of memories can instead be used as the DDR memory. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention. Note that any of the aspects below can be used in any combination with each other and with any of the disclosed embodiments.

In an embodiment, memory controller is configured to communicate via a dual data rate (DDR) interface with a dynamic random access memory (DRAM), and the memory controller includes a first storage circuit configured to store trained center eyes for the DDR interface, wherein each trained center eye includes a corresponding trained delay value between a data signal (DQ) and a data strobe signal (DQS) of the DDR interface, wherein the corresponding trained delay values are used during normal operation of the memory controller for performing memory operations; a second storage circuit configured to store boundary points for the DDR interface; and test circuitry. The test circuitry is configured to, during normal operation of the memory controller, halt normal operation of the memory controller; use the corresponding trained delay value of a trained center eye for a first bit lane of the DDR interface as a starting delay value in performing a search for a first boundary point of a data eye margin corresponding to the first bit lane by repeatedly adjusting a delay between a DQ of the first bit lane and a corresponding DQS and performing a test with each adjusted delay; store the first boundary point in the second storage circuit; restore the delay between the DQ of the first bit lane and the corresponding DQS back to the corresponding trained delay value; and resume normal operation with the restored corresponding trained delay value. In one aspect of the above embodiment, the test includes a set of write, read, and compare operations to determine if the test passes or fails, wherein the first boundary point occurs at a boundary between a passing test at a corresponding passing adjusted delay and a failing test at a corresponding failing adjusted delay. In a further aspect, the write and read operations of the set of write, read, and compare operations is performed using a full bus width of the DDR interface. In another aspect, the first bit lane is one of multiple bit lanes, and the first boundary point corresponds to the multiple bit lanes, in which the memory controller is configured to perform the search for the first boundary point by repeatedly simultaneously adjusting delays between DQs of the multiple bit lanes and corresponding DQSs such that each test is performed using the multiple bit lanes with the adjusted delays. In a further aspect, the multiple bit lanes is a data byte lane of the DDR interface. In another further aspect, the multiple bit lanes are all the data bit lanes of the DDR interface. In another aspect of the above embodiment, the repeatedly adjusting the delay between the DQ of the first bit lane and the corresponding DQS is performed in accordance with a binary search until the first boundary point is determined, wherein each adjusted delay in accordance with the binary search is less than the corresponding trained delay value. In a further aspect, the test circuitry is further configured to use the corresponding trained delay value of the trained center eye for the first bit lane of the DDR interface as the starting delay value in performing a search for a second boundary point of the data eye margin corresponding to the first bit lane by repeatedly adjusting the delay between the DQ of the first lane and the corresponding DQS in accordance with a second binary search and performing a test with each adjusted delay of the secondary binary search until the second boundary point, different from the first boundary point, is determined, wherein each adjusted delay in accordance with the second binary search is greater than the corresponding trained delay value; and store the second boundary point in the second storage circuit. In another aspect of the above embodiment, halting normal operation of the memory controller comprises halting memory operations to the DRAM. In another aspect, the memory controller further includes a health monitor configured to determine health of the DRAM based on the stored boundary points in the second storage circuit.

In another embodiment, a memory controller is configured to communicate via a dual data rate (DDR) interface with a dynamic random access memory (DRAM), and the memory controller includes a first storage circuit configured to store trained center eyes for the DDR interface, wherein each trained center eye includes a corresponding trained parameter value selected from a trained delay value between a data signal (DQ) and a data strobe signal (DQS) of the DDR interface or a trained reference value of the DDR interface, wherein the corresponding trained parameter values are used during normal operation of the memory controller for performing memory operations; a second storage circuit configured to store boundary points for the DDR interface; and test circuitry. The test circuitry is configured to, during normal operation of the memory controller, halt normal operation of the memory controller for a plurality of discrete time slices, wherein normal operation is resumed after each discrete time slice, wherein, during each time slice, a search is performed to determine a boundary point of a data eye margin corresponding to a selected bit lane of the DDR interface using the corresponding trained parameter value of a trained center eye for the selected bit lane as a starting parameter value for the search performed by repeatedly adjusting a parameter of the DDR interface and performing a write-read-compare test with each adjusted parameter using the selected bit lane, wherein the boundary point is stored into the second storage circuit, and, prior to resuming normal operation at the completion of each time slice, the parameter of the DDR interface is restored back to the corresponding trained parameter value. In one aspect, during each discrete time slice, multiple searches are performed to determine multiple boundary points of the data eye margin corresponding to the selected bit lane, wherein the multiple boundary points are stored into the second storage circuit. In a further aspect, during a first discrete time slice, the parameter of the DDR interface that is repeatedly adjusted is a delay between a DQ of the selected lane and a corresponding DQS, and, during a second discrete time slice, the parameter of the DDR interface that is repeatedly adjusted is a voltage value used by the DDR interface. In another aspect of the another embodiment, the memory controller further includes a health monitor configured to determine health of the DRAM based on a plurality of stored boundary points in the second storage circuit, but without requiring generation of a full data eye margin. In an other aspect, the search performed during each time slice is performed as a binary search to determine the boundary point.

In yet another embodiment, a memory controller is configured to communicate via a dual data rate (DDR) interface with a dynamic random access memory (DRAM), and the memory controller includes a first storage circuit configured to store trained center eyes for the DDR interface, wherein each trained center eye includes a corresponding trained delay value and a corresponding trained voltage value, wherein the corresponding trained delay values and the corresponding trained voltage values are used during normal operation of the memory controller for performing memory operations; a second storage circuit configured to store boundary points for the DDR interface; and test circuitry. The test circuitry is configured to, during normal operation of the memory controller, halt normal operation of the memory controller; use the corresponding trained delay values of a trained center eye for a set of bit lanes of the DDR interface as starting delay values in performing a binary search by repeatedly simultaneously adjusting delays between each DQ of the set of bit lanes and a DQS which corresponds to all DQs of the set of bit lanes and performing a write-read-compare test with each adjustment until a first boundary point of a data eye margin corresponding to the set of bit lanes is determined; store the first boundary point in the second storage circuit; restore the delays between each DQ of the set of bit lanes and the DQS back to the corresponding trained delay values; and resume normal operation with the restored corresponding trained delay values. The memory controller further includes a health monitor configured to determine health of the DRAM based on the stored boundary points in the second storage circuit. In one aspect of the yet another embodiment, the binary search is performed using the trained voltage reference value while the delays are adjusted. In another aspect, the binary search is performed using an adjusted voltage reference value based on the trained voltage reference value while the delays are adjusted. In yet another aspect, halting normal operation of the memory controller includes halting memory operations to the DRAM, wherein the halting normal operation and the resuming normal operation are each performed without requiring resets of the memory controller. In yet an other embodiment, the health monitor circuit is configured to determine health of the DRAM based on a plurality of stored boundary points in the second storage circuit, but without requiring generation of a full data eye margin.

What is claimed is:

1. A memory controller configured to communicate via a dual data rate (DDR) interface with a dynamic random access memory (DRAM), the memory controller comprising:
   a first storage circuit configured to store trained center eyes for the DDR interface, wherein each trained center eye includes a corresponding trained delay value between a data signal (DQ) and a data strobe signal (DQS) of the DDR interface, wherein the corresponding trained delay values are used during normal operation of the memory controller for performing memory operations;

a second storage circuit configured to store boundary points for the DDR interface; and test circuitry configured to, during normal operation of the memory controller:

halt normal operation of the memory controller;

use the corresponding trained delay value of a trained center eye for a first bit lane of the DDR interface as a starting delay value in performing a search for a first boundary point of a data eye margin corresponding to the first bit lane by repeatedly adjusting a delay between a DQ of the first bit lane and a corresponding DQS and performing a test with each adjusted delay;

store the first boundary point in the second storage circuit;

restore the delay between the DQ of the first bit lane and the corresponding DQS back to the corresponding trained delay value; and resume normal operation with the restored corresponding trained delay value.

2. The memory controller of claim 1, wherein the test comprises a set of write, read, and compare operations to determine if the test passes or fails, wherein the first boundary point occurs at a boundary between a passing test at a corresponding passing adjusted delay and a failing test at a corresponding failing adjusted delay.

3. The memory controller of claim 2, wherein the write and read operations of the set of write, read, and compare operations is performed using a full bus width of the DDR interface.

4. The memory controller of claim 1, wherein the first bit lane is one of multiple bit lanes, and the first boundary point corresponds to the multiple bit lanes, in which the memory controller is configured to perform the search for the first boundary point by repeatedly simultaneously adjusting delays between DQs of the multiple bit lanes and corresponding DQSs such that each test is performed using the multiple bit lanes with the adjusted delays.

5. The memory controller of claim 4, wherein the multiple bit lanes is a data byte lane of the DDR interface.

6. The memory controller of claim 4, wherein the multiple bit lanes are all the data bit lanes of the DDR interface.

7. The memory controller of claim 1, wherein the repeatedly adjusting the delay between the DQ of the first bit lane and the corresponding DQS is performed in accordance with a binary search until the first boundary point is determined, wherein each adjusted delay in accordance with the binary search is less than the corresponding trained delay value.

8. The memory controller of claim 7, wherein the test circuitry is further configured to:

use the corresponding trained delay value of the trained center eye for the first bit lane of the DDR interface as the starting delay value in performing a search for a second boundary point of the data eye margin corresponding to the first bit lane by repeatedly adjusting the delay between the DQ of the first lane and the corresponding DQS in accordance with a second binary search and performing a test with each adjusted delay of the secondary binary search until the second boundary point, different from the first boundary point, is determined, wherein each adjusted delay in accordance with the second binary search is greater than the corresponding trained delay value; and store the second boundary point in the second storage circuit.

9. The memory controller of claim 1, wherein halting normal operation of the memory controller comprises halting memory operations to the DRAM.

10. The memory controller of claim 1, further comprising a health monitor configured to determine health of the DRAM based on the stored boundary points in the second storage circuit.

11. A memory controller configured to communicate via a dual data rate (DDR) interface with a dynamic random access memory (DRAM), the memory controller comprising:

a first storage circuit configured to store trained center eyes for the DDR interface, wherein each trained center eye includes a corresponding trained parameter value selected from a trained delay value between a data signal (DQ) and a data strobe signal (DQS) of the DDR interface or a trained reference value of the DDR interface, wherein the corresponding trained parameter values are used during normal operation of the memory controller for performing memory operations;

a second storage circuit configured to store boundary points for the DDR interface; and test circuitry configured to, during normal operation of the memory controller:

halt normal operation of the memory controller for a plurality of discrete time slices, wherein normal operation is resumed after each discrete time slice, wherein, during each time slice:

a search is performed to determine a boundary point of a data eye margin corresponding to a selected bit lane of the DDR interface using the corresponding trained parameter value of a trained center eye for the selected bit lane as a starting parameter value for the search performed by repeatedly adjusting a parameter of the DDR interface and performing a write-read-compare test with each adjusted parameter using the selected bit lane, wherein the boundary point is stored into the second storage circuit, and, prior to resuming normal operation at the completion of each time slice, the parameter of the DDR interface is restored back to the corresponding trained parameter value.

12. The memory controller of claim 11, wherein, during each discrete time slice, multiple searches are performed to determine multiple boundary points of the data eye margin corresponding to the selected bit lane, wherein the multiple boundary points are stored into the second storage circuit.

13. The memory controller of claim 12, wherein, during a first discrete time slice, the parameter of the DDR interface that is repeatedly adjusted is a delay between a DQ of the selected lane and a corresponding DQS, and, during a second discrete time slice, the parameter of the DDR interface that is repeatedly adjusted is a voltage value used by the DDR interface.

14. The memory controller of claim 11, further comprising a health monitor configured to determine health of the DRAM based on a plurality of stored boundary points in the second storage circuit, but without requiring generation of a full data eye margin.

15. The memory controller of claim 11, wherein the search performed during each time slice is performed as a binary search to determine the boundary point.

16. A memory controller configured to communicate via a dual data rate (DDR) interface with a dynamic random access memory (DRAM), the memory controller comprising:

a first storage circuit configured to store trained center eyes for the DDR interface, wherein each trained center eye includes a corresponding trained delay value and a corresponding trained voltage value, wherein the corresponding trained delay values and the corresponding trained voltage values are used during normal operation of the memory controller for performing memory operations;

a second storage circuit configured to store boundary points for the DDR interface;

test circuitry configured to, during normal operation of the memory controller:

halt normal operation of the memory controller;

use the corresponding trained delay values of a trained center eye for a set of bit lanes of the DDR interface as starting delay values in performing a binary search by repeatedly simultaneously adjusting delays between each DQ of the set of bit lanes and a DQS which corresponds to all DQs of the set of bit lanes and performing a write-read-compare test with each adjustment until a first boundary point of a data eye margin corresponding to the set of bit lanes is determined;

store the first boundary point in the second storage circuit;

restore the delays between each DQ of the set of bit lanes and the DQS back to the corresponding trained delay values; and resume normal operation with the restored corresponding trained delay values; and a health monitor configured to determine health of the DRAM based on the stored boundary points in the second storage circuit.

17. The memory controller of claim 16, wherein the binary search is performed using the trained voltage reference value while the delays are adjusted.

18. The memory controller of claim 16, wherein the binary search is performed using an adjusted voltage reference value based on the trained voltage reference value while the delays are adjusted.

19. The memory controller of claim 16, wherein halting normal operation of the memory controller comprises halting memory operations to the DRAM, wherein the halting normal operation and the resuming normal operation are each performed without requiring resets of the memory controller.

20. The memory controller of claim 16, wherein the health monitor circuit is configured to determine health of the DRAM based on a plurality of stored boundary points in the second storage circuit, but without requiring generation of a full data eye margin.

* * * * *